US006613586B2

United States Patent
Bailey

(10) Patent No.: US 6,613,586 B2
(45) Date of Patent: Sep. 2, 2003

(54) HYDROGEN BARRIER ENCAPSULATION TECHNIQUES FOR THE CONTROL OF HYDROGEN INDUCED DEGRADATION OF FERROELECTRIC CAPACITORS IN CONJUNCTION WITH MULTILEVEL METAL PROCESSING FOR NON-VOLATILE INTEGRATED CIRCUIT MEMORY DEVICES

(75) Inventor: Richard A. Bailey, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 12 days.

(21) Appl. No.: 09/783,496

(22) Filed: Feb. 13, 2001

(65) Prior Publication Data

US 2003/0006439 A1 Jan. 9, 2003

Related U.S. Application Data

(62) Division of application No. 09/164,952, filed on Oct. 1, 1998, now Pat. No. 6,249,014.

(51) Int. Cl.[7] ...................... H01L 21/00; H01L 21/8242
(52) U.S. Cl. ........................................... 438/3; 438/240
(58) Field of Search .......................... 438/3, 240, 256, 438/239, 253, 399; 257/295, 310; 365/145

(56) References Cited

U.S. PATENT DOCUMENTS

| 4,700,457 A | 10/1987 | Matsukawa ................ 438/396 |
| 4,860,254 A | 8/1989 | Pott et al. .................... 365/145 |
| 4,888,733 A | 12/1989 | Mobley ....................... 365/145 |
| 4,914,627 A | 4/1990 | Eaton, Jr. et al. ........... 365/145 |
| 5,031,144 A | 7/1991 | Persky ........................ 365/145 |
| 5,119,154 A | 6/1992 | Gnadinger .................. 257/295 |
| 5,122,477 A | 6/1992 | Wolters et al. ................. 438/3 |
| 5,155,573 A | 10/1992 | Abe et al. .................... 257/304 |
| 5,192,704 A | 3/1993 | McDavid et al. ............... 438/3 |
| 5,273,927 A | 12/1993 | Gnadinger ...................... 438/3 |
| 5,293,075 A | 3/1994 | Onishi et al. ................ 257/769 |

(List continued on next page.)

OTHER PUBLICATIONS

J. Kudo, et al., "A High Stability Electrode Technology for Stacked $SrBi_2Ta_2O_9$ Capacitors Applicable to Advanced Ferroelectric Memory", IEEE, pp. 25.4, 1–25.4.4, 1997.

(List continued on next page.)

Primary Examiner—Shouxiang Hu
(74) Attorney, Agent, or Firm—Hogan & Hartson, LLP

(57) ABSTRACT

A hydrogen barrier encapsulation technique for the control of hydrogen induced degradation of ferroelectric capacitors in non-volatile integrated circuit memory devices. The resultant device structure ameliorates the hydrogen induced degradation of ferroelectric capacitors by completely encapsulating the capacitor within a suitable hydrogen barrier material, such as chemical vapor deposition ("CVD") or sputtered silicon nitride, thus ensuring process compatibility with industry standard process steps. Although the deposition process for CVD $Si_3N_4$ itself contains hydrogen, the deposition time may be kept relatively short thereby allowing the TiN local interconnect layer to act as a "short term" hydrogen barrier. The techniques of the present invention are applicable to all known ferroelectric dielectrics including Perovskites and layered Perovskites (whether doped or undoped) including PZT, PLZT, BST, SBT and others while simultaneously allowing for a potentially broader choice of electrode materials and the use of a forming gas anneal process step on the completed IC structure.

14 Claims, 14 Drawing Sheets

U.S. PATENT DOCUMENTS

| | | |
|---|---|---|
| 5,303,186 A | 4/1994 | Yamauchi ............... 365/185.08 |
| 5,335,138 A | 8/1994 | Sandhu et al. ............... 361/303 |
| 5,350,705 A | 9/1994 | Brassington et al. ........ 257/295 |
| 5,371,700 A | 12/1994 | Hamada ..................... 365/149 |
| 5,375,085 A | 12/1994 | Gnade et al. ................ 365/145 |
| 5,382,817 A | 1/1995 | Kashihara et al. ........... 257/295 |
| 5,383,150 A | 1/1995 | Nakamura et al. ........... 365/145 |
| 5,390,143 A | 2/1995 | Manning ..................... 365/145 |
| 5,396,095 A | 3/1995 | Wolters et al. .............. 257/310 |
| 5,416,735 A | 5/1995 | Onishi et al. ................ 365/145 |
| 5,438,023 A | 8/1995 | Argos, Jr. et al. ............... 438/3 |
| 5,440,173 A | 8/1995 | Evans, Jr. et al. ........... 257/751 |
| 5,475,248 A | 12/1995 | Takenaka .................... 257/295 |
| 5,481,490 A | 1/1996 | Watanabe et al. ............ 365/145 |
| 5,536,672 A | 7/1996 | Miller et al. ..................... 438/3 |
| 5,554,559 A | 9/1996 | Wolters et al. .................. 438/3 |
| 5,638,319 A | 6/1997 | Onishi et al. ................ 365/145 |
| 5,679,969 A | 10/1997 | Evans, Jr. et al. ........... 257/295 |
| 5,696,394 A | 12/1997 | Jones, Jr. et al. ............ 257/295 |
| 5,716,875 A | 2/1998 | Jones, Jr. et al. ................ 438/3 |
| 5,953,619 A * | 9/1999 | Miyazawa et al. .......... 438/396 |

OTHER PUBLICATIONS

In Seon Park, et al., "Ultra–thin EBL (Encapsulated Barrier Layer) for Ferroelectric Capacitor", *IEEE*, pp. 25.6.1–25.6.4, 1997.

* cited by examiner

HYDROGEN BARRIER ENCAPSULATION TECHNIQUES FOR THE CONTROL OF HYDROGEN INDUCED DEGRADATION OF FERROELECTRIC CAPACITORS IN CONJUNCTION WITH MULTILEVEL METAL PROCESSING FOR NON-VOLATILE INTEGRATED CIRCUIT MEMORY DEVICES

CROSS REFERENCE TO RELATED APPLICATIONS

The present application is a divisional application of U.S. patent application Ser. No. 09/164,952, filed Oct. 1, 1998 now U.S. Pat. No. 6,249,014.

The present invention is related to the subject matter disclosed in U.S. patent application Ser. No. 08/728,256 filed Oct. 8, 1996 for "Yield Enhancement Technique for Integrated Circuit Processing to Reduce Effects of Undesired Dielectric Moisture Retention and Subsequent Hydrogen Out-Diffusion" as well as U.S. patent application Ser. No. 08/700,076 filed Aug. 20, 1996; Ser. No. 08/728,740 filed Oct. 11, 1996; Ser. No. 08/828,157 filed May 27, 1997 and Ser. No. 09/085,280 filed May 27, 1998, all assigned to Ramtron International Corporation, Colorado Springs, Colo., assignee of the present invention, the disclosure of which is herein specifically incorporated by this reference.

BACKGROUND OF THE INVENTION

The present invention relates, in general, to the field of integrated circuit ("IC") manufacturing processes. More particularly, the present invention relates to hydrogen barrier encapsulation techniques for the control of hydrogen induced degradation of ferroelectric memory devices, in particular with respect to multi-level metal IC processing.

Certain memory devices, such as the FRAM® (FRAM is a registered trademark of Ramtron International Corporation, Colorado Springs, Colo.) family of solid state, random access memory integrated circuits, provide non-volatile data storage through the use of a ferroelectric dielectric material which may be polarized in one direction or another in order to store a binary value representative of a logic level "one" or "zero". The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage ("V") and resulting polarization ("Q") states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to the assignee of the present invention, the disclosures of which are herein specifically incorporated by this reference.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "one" or "zero" at the IC output pins provided that "Q" is sufficiently large. In a conventional two transistor/two capacitor ("2C/2T") ferroelectric memory cell, (one transistor/one capacitor "1T/1C" devices have also been described) a pair of two data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ("nsec.") time period. The electrode is then brought back to circuit ground for the other cell capacitor to be written for an additional nominal 100 nsec. In any event, the switching polarization ("$Q_{sw}$", where $Q_{sw}=2Pr$, the remnant polarization) of the device must be sufficiently large for the signal presented to the sense amplifiers to be accurately read or the performance of the device is severely degraded should $Q_{sw}$ be too low for reliable operation.

It has been observed that when a ferroelectric capacitor is exposed to hydrogen species, the ferroelectric properties of the capacitor are severely degraded. The rate at which this degradation occurs is a function of the flux of hydrogen which comes in direct contact with the ferroelectric capacitor and temperature although the type of hydrogen species, (i.e. monatomic vs. diatomic) is also a factor. Diffusion of hydrogen through conductive and non-conductive layers surrounding the ferroelectric capacitor is a function of hydrogen concentration, temperature, time and the diffusivity of hydrogen through a given material in accordance with Fick's laws of diffusion. As a consequence, control of these factors can be used to ameliorate or reduce ferroelectric device degradation due to the presence of hydrogen.

Following the formation of the ferroelectric capacitor structures on an integrated circuit ("IC") device, some type of electrical interconnect is required to couple the transistor and capacitor components of the IC device. Typical IC interconnect materials include alloys of aluminum, tungsten and oxide non-conductive layers. Most of the industry standard process steps used for such interconnect processing contain hydrogen species or require process temperatures at or above 400° C. or both.

Recently, two mechanisms for hydrogen induced degradation in IC devices have been identified:

1) Hydrogen generated external to the die due to process steps which contain hydrogen (either deliberately introduced into the process-step or as a byproduct of the process step). These process steps may include chemical vapor deposition ("CVD") of oxides or refractory materials, anneals or etch process steps; and 2) Hydrogen generated within the body or structure of the die. For example, water adsorbed within oxide layers has been shown to diffuse through the oxide layer at fairly low temperatures (~400° C.) and react with metals within the die structure which cause the dissociation of the water molecule and subsequently generate hydrogen species which in turn degrade ferroelectric device performance.

Multilevel metal processes for standard memory, embedded or logic devices using design rules of 0.5 μm or smaller commonly include process steps such as tungsten plug deposition, high density plasma ("HDP", silane based) interlevel oxide deposition or plasma tetraethyloxysilicate ("TEOS") oxide deposition, chemical mechanical polishing ("CMP") for planarization of oxide or tungsten plug layers and hot metal reflow (420° C. up to 520° C. wafer substrate temperature) aluminum deposition. All of these process steps generate hydrogen either directly or through various secondary mechanisms. CVD tungsten plug deposition, for example, uses roughly 3% (or higher) hydrogen (at 400° C. to 500° C.) for the carrier gas, and HDP oxide deposition uses silane which reacts to form $SiO_2$, water and hydrogen. CMP utilizes a water slurry which causes water adsorption into the oxide films. Subsequently, during any process step using temperatures of 400° C. or greater (tungsten plug deposition, interlevel dielectric ("ILD") oxide deposition or hot aluminum reflow deposition), water will diffuse through the oxide layer and disassociate at metal interfaces to form hydrogen and oxygen as previously noted.

Therefore, in order to successfully integrate ferroelectric capacitors with multilevel metal process steps it is necessary to either: 1) remove the hydrogen from the multilevel metal process steps altogether; or 2) to make the ferroelectric device more immune to hydrogen degradation.

Completely removing the hydrogen from industry standard process steps would, naturally, require a great deal of new process development. If such were even possible to achieve, it would likely result in many non-standard processes and equipment configurations which would increase the cost and complexity of manufacturing ferroelectric IC's.

A more desirable method, therefore would be to somehow render the ferroelectric capacitor more immune to hydrogen degradation. Improving the hydrogen immunity of ferroelectric capacitors, however, has long been a major impediment to ferroelectric process integration. In this regard, various methods have been reported including doping the ferroelectric material itself to make it less susceptible to hydrogen damage (often at the compromise of other ferroelectric electrical properties) or the use of compound or exotic electrode materials. Several of these methods have been successful in somewhat reducing hydrogen induced degradation, but none have made the ferroelectric capacitor completely immune to the multiple process steps required for multilevel metal processing.

Several authors have heretofore reported the use of a hydrogen barrier layer used to shield the ferroelectric capacitor from hydrogen damage during subsequent processing. Although a number of materials have proven useful as hydrogen barrier materials, no structure has as yet been proposed or demonstrated which adequately seals the ferroelectric capacitor from hydrogen damage. In this regard, one known approach includes the use of an alumina ($Al_2O_3$) or rutile ($TiO_2$) barrier over a lead zirconium titanate (PZT) capacitor where the hydrogen barrier material is first placed over the side walls and top of the ferroelectric cap structure. (See IEDM 1997, structures proposed by Samsung using $Al_2O_3$; p. 617 and Sharp using $TiO_2$; p 609). Subsequently, a contact opening is formed through the barrier material in order to provide an interconnect to the ferroelectric capacitor top electrode. However, once such a contact opening is made through the hydrogen barrier material, it can no longer effectively prevent the flux of hydrogen to the ferroelectric capacitor. Stated another way, once the contact opening is made, the barrier effects are essentially rendered useless and during subsequent processing steps, the rate of degradation due to hydrogen damage, while somewhat reduced, is never totally eliminated due to the fact that a serious flaw exists in the structure in the form of the hole through the barrier layer. This hydrogen degradation results in a $Q_{sw}$ switching loss which is a function of the top electrode contact ("TEC")/top electrode area ("TE") area ratio. As a result, although a barrier layer may somewhat improve the switched charge of the ferroelectric capacitor, switched charge degradation as a function of the TEC/TE area ratio still occurs.

In another work, (c.f. U.S. Pat. No. 5,554,559) a blanket hydrogen barrier layer is used over the entire ferroelectric capacitor after formation of the top electrode contact. However, this does not ultimately protect the capacitor from water vapor or hydrogen attack from the oxide layers underneath the silicon nitride blanket layer. Also, a sidewall contact is used to connect the ferroelectric capacitor to the drain of the pass transistor. This structure may be problematic in a manufacturing environment.

In yet another work, (c.f. U.S. Pat. No. 5,536,672) a blanket $TiO_2/Si_3N_4$ layer is used under the ferroelectric stack to block lead in the PZT capacitor from diffusing into the BPSG layer overlying the CMOS transistors. Nevertheless, this structure has made no provision for blocking hydrogen from diffusing through the top electrode contact region during subsequent processing.

SUMMARY OF THE INVENTION

In accordance with the technique of the present invention, an improved hydrogen barrier structure is advantageously utilized in order to completely encapsulate the ferroelectric capacitor and protect it from hydrogen or moisture during subsequent process steps. Subsequent process steps may include many different combinations of interconnect steps which are well known in semiconductor IC processing, including, for example, the sputter deposition of titanium (Ti), titanium nitride (TiN), or aluminum alloys, the CVD deposition of oxides, nitrides, or tungsten, CMP polishing of oxide and conductive layers, the etching of oxides and conductive film layers and the like. In accordance with specific implementations of the technique of the present invention disclosed hereinafter, four representative interconnect structures are illustrated integrated in conjunction with an encapsulated ferroelectric capacitor, although the technique is similarly applicable to many other interconnect schemes as well.

In accordance with the specific embodiments of the present invention disclosed herein an important feature is the addition of a hydrogen barrier layer over the ferroelectric capacitor top electrode contact. This barrier layer effectively acts as a 'cork' to seal the top of the encapsulated hydrogen barrier structure, rendering the entire structure highly resistant to hydrogen penetration. Materials for forming the "cork" material can be selected from any of a number of materials or combinations of materials commonly used in the semiconductor industry which demonstrate some barrier properties to hydrogen. These include, but are not limited to, silicon nitride (deposited by low temperature plasma enhanced chemical vapor deposition ("PECVD"), sputter deposition or other techniques), titanium nitride, alumina ($Al_2O_3$) $TiO_2$ and other hydrogen barrier forming materials.

Although the barrier material used in the preferred embodiment of this work, silicon nitride ($Si_3N_4$), is a very good hydrogen barrier, it is still not a perfect hydrogen barrier. Given an adequately long time at elevated temperature, some hydrogen will eventually diffuse through silicon nitride or other hydrogen barrier materials. Thicker barrier layers may be used to limit the amount of hydrogen diffusion through these layers. However thicker barrier films will reduce manufacturing throughput and may compromise the manufacturability and performance of the ferroelectric product. Consequently, a wise choice of process flow and minimal time at elevated process temperature for subsequent process steps will allow use of minimal barrier thicknesses and facilitate an optimized manufacturing process which may advantageously include a forming gas (or hydrogen) anneal process step upon the completed integrated circuit structure.

Particularly disclosed herein is an integrated circuit device and a process for forming the same comprising a plurality of memory cells, each of the memory cells comprising at least one capacitor. The capacitor includes a bottom electrode overlying an insulating layer; a dielectric layer overlying the bottom electrode; a top electrode overlying the dielectric layer; a contact providing electrical coupling to the top electrode; and a hydrogen barrier material formed on an upper surface of the contact.

Further disclosed herein is an integrated circuit device, including at least one capacitor integrated thereon, and a process for forming the same which comprises: a substrate having a major surface thereof; a first hydrogen barrier material layer overlying the substrate; a first insulating layer overlying the first hydrogen barrier material layer; a first electrode layer overlying the first insulating layer and substantially coextensive therewith; a dielectric layer overlying the first insulating layer; a second electrode layer overlying the dielectric layer; a contact electrically adjoining the second electrode layer at an upper surface thereof; a second insulating layer overlying exposed portions of the first electrode layer, the dielectric layer and the second electrode layer adjacent the contact; a second hydrogen barrier material layer contiguous with the first hydrogen barrier material layer and overlying the second insulating layer; and an additional hydrogen barrier material layer overlying the contact.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
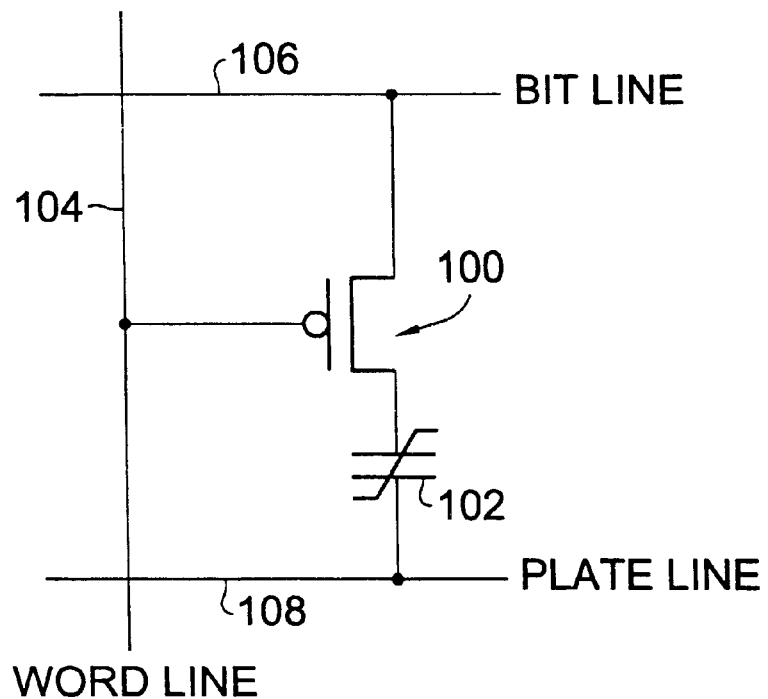
FIG. 1 is a simplified schematic diagram of a typical 1T/1C memory cell comprising an access transistor and series coupled capacitor utilizing a ferroelectric dielectric to provide non-volatile storage of data therein.

With reference now to FIG. 1, a simplified schematic diagram of a typical 1T/1C memory cell is shown. In a non-volatile ferroelectric memory device, the memory cell comprises an access transistor 100 and series coupled capacitor 102 utilizing a ferroelectric dielectric such as PZT, lead lanthanum zirconium titanate ("PLZT"), strontium bismuth tantalate ("SBT"), barium strontium titanate ("BST") or other suitable material to provide storage of a logic level "one" or "zero" therein. The gate terminal of the access transistor 100 is coupled to a word line 104 while the drain terminal is coupled to a bit line 106. The source terminal of the access transistor 100 is coupled to one terminal of the capacitor 102 while the opposite terminal is coupled to a plate line 108.

Figure 2:
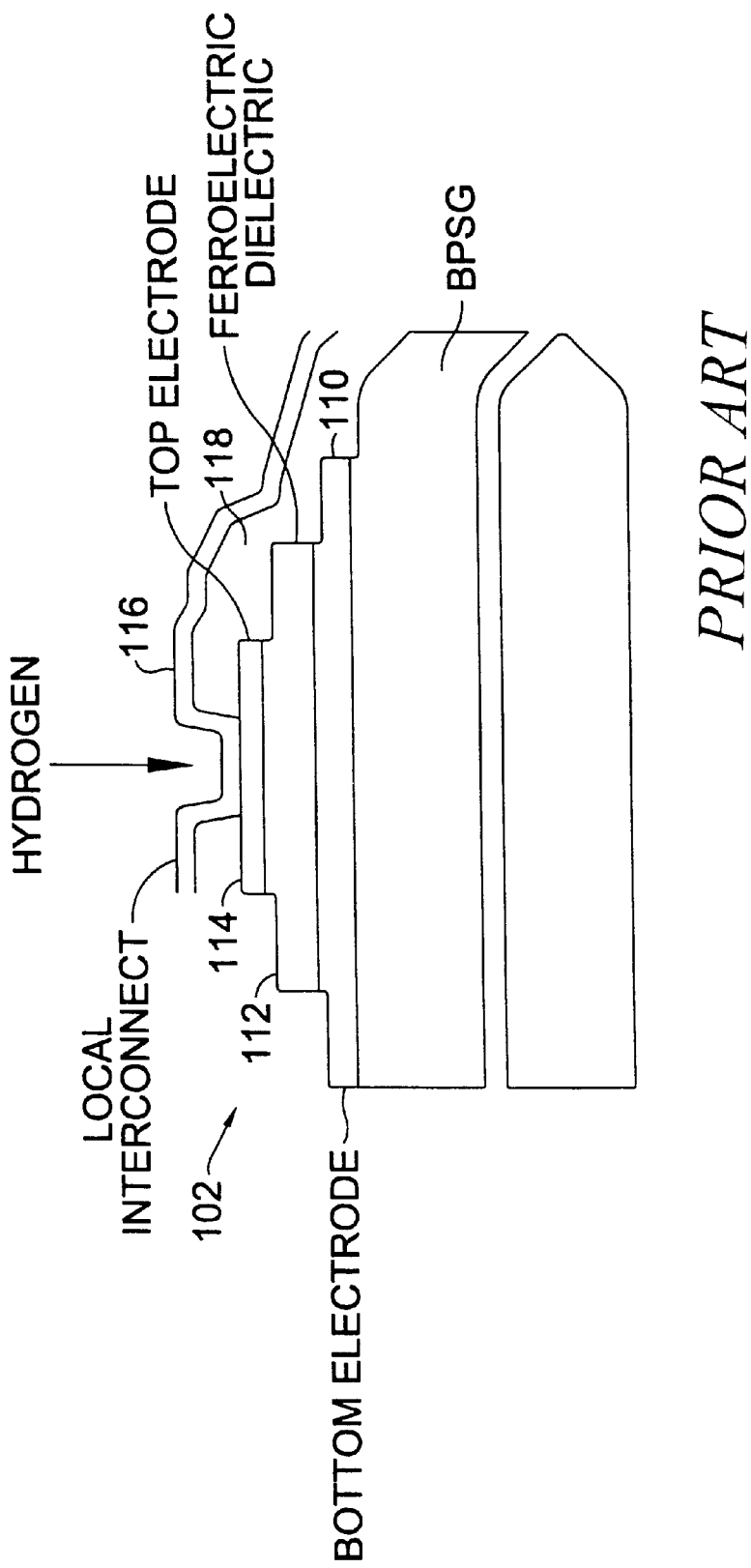
FIG. 2 is a partial cross-sectional view of the ferroelectric capacitor of FIG. 1 illustrating the bottom electrode, ferroelectric dielectric, top electrode and top electrode contact by means of a local interconnect ("LI") which provides one means for hydrogen to induce degradation in an integrated circuit ferroelectric memory device.

With reference additionally now to FIG. 2, a partial cross-sectional view of the ferroelectric capacitor 102 of FIG. 1 is shown. The capacitor 102 comprises, in pertinent part, a bottom electrode 110 ("BE") formed overlying a semiconductor substrate including a borophosphosilicate glass ("BPSG") layer, a ferroelectric dielectric 112 and a top electrode 114 ("TE"). A top electrode contact ("TEC") is effectuated by means of a local interconnect 116 ("LI") formed overlying an insulating material comprising local interconnect oxide 118 ("FEO"). As previously noted, the TEC provides one of the means for hydrogen to induce degradation in an integrated circuit ferroelectric memory device.

Figure 3:
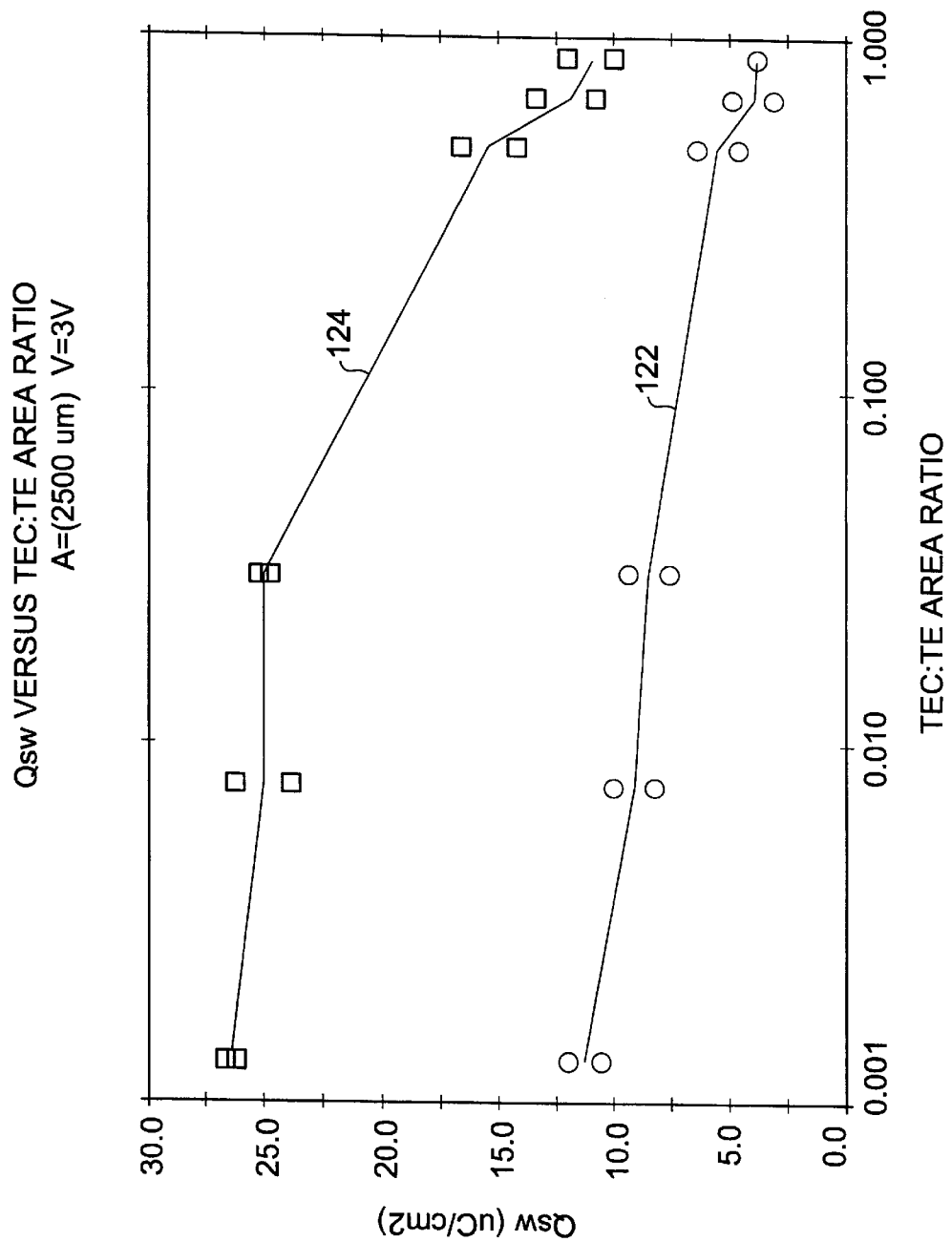
FIG. 3 is a graphical representation of switching charge ($Q_{sw}$ in $\mu C/cm^2$) versus the top electrode contact ("TEC") to top electrode ("TE") area ratio for a conventional integrated circuit ferroelectric memory device (plot "○") and one utilizing a sidewall only encapsulation technique (plot "□")

With reference additionally now to FIG. 3, a graphical representation of switching charge ($Q_{sw}$ in $\mu C/cm^2$) versus the top electrode contact ("TEC") to top electrode ("TE") area ratio for a conventional integrated circuit ferroelectric memory device (plot 122 "○") and one utilizing a sidewall only encapsulation technique (plot 124 "□") is shown. As indicated, as the TEC:TE area ratio increases from substantially 0.001 to 1.000, the available switching charge for a conventional ferroelectric capacitor (plot 122) falls from about 12.0 to less than 5.0 $\mu C/cm^2$, roughly a 60% drop in $Q_{sw}$. In comparison, the switching charge of a device produced with sidewall only encapsulation (plot 124) exhibits a switching charge of about 27.0 $\mu C/cm^2$ at a TEC:TE area ratio of 0.001, falling to about 11.0 $\mu C/cm^2$ at a TEC:TE area ratio of 1.000, (again, roughly a 60% drop in $Q_{sw}$). Although the sidewall only encapsulation demonstrates an overall improvement in $Q_{sw}$, in the region of greatest interest for IC manufacturing in this application (i.e. a TEC:TE area ratio>0.1), $Q_{sw}$ is reduced substantially compared with the $Q_{sw}$ which would be available if no degradation occurred through the TEC opening.

Figure 4:
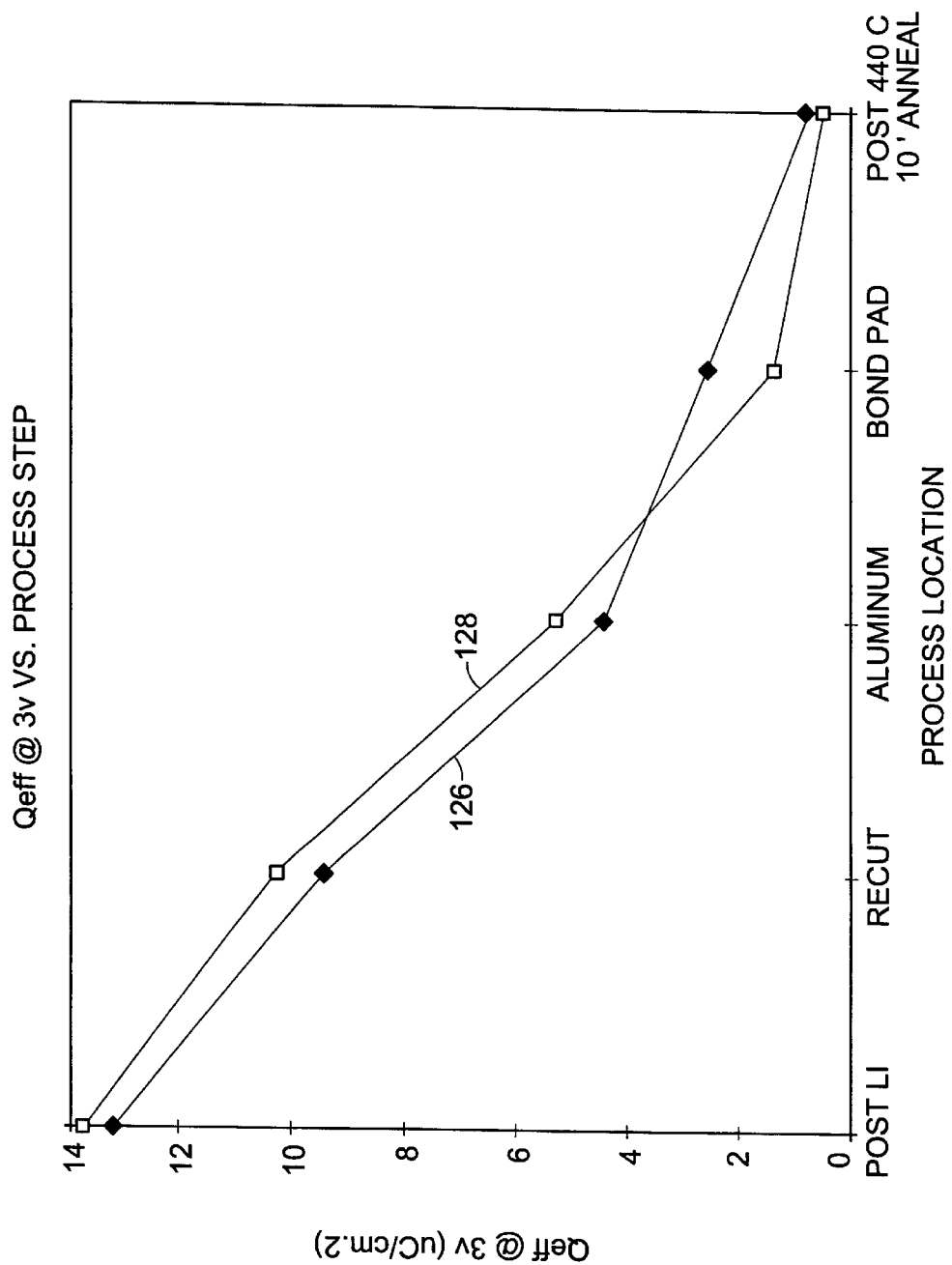
FIG. 4 is a graphical representation of the effective charge ($Q_{eff}$ at 3 volts in $\mu C/cm^2$, where $Q_{eff} \approx Q_{sw}$) versus integrated circuit process step location for two conventionally processed series of ferroelectric memory devices.

With reference additionally now to FIG. 4, a graphical representation of the effective charge ($Q_{eff}$ at 3 volts in $\mu C/cm^2$) versus integrated circuit process step location for two conventionally processed series of ferroelectric memory devices is shown. As shown by plot 126, $Q_{eff}$ is at a peak of about 13.5 $\mu C/cm^2$ at the post local interconnect ("LI") process step, falling to about 9.5 at re-cut, to just about 4.0 at the aluminum metalization step, to less than 3.0 at bond pad formation to about 0.5 $\mu C/cm^2$ following a post 440° C., ten minute annealing step to simulate a multi-level metal process step. Similarly, as shown by plot 128, another conventionally processed ferroelectric capacitor exhibits a peak $Q_{eff}$ of almost 14.0 $\mu C/cm^2$ at the post LI step, about 10.5 at re-cut, falling to about 5.0 at aluminum metalization, to about 1.0 at bond pad formation to substantially 0.2 $\mu C/cm^2$ during the final annealing operation.

Figure 5:
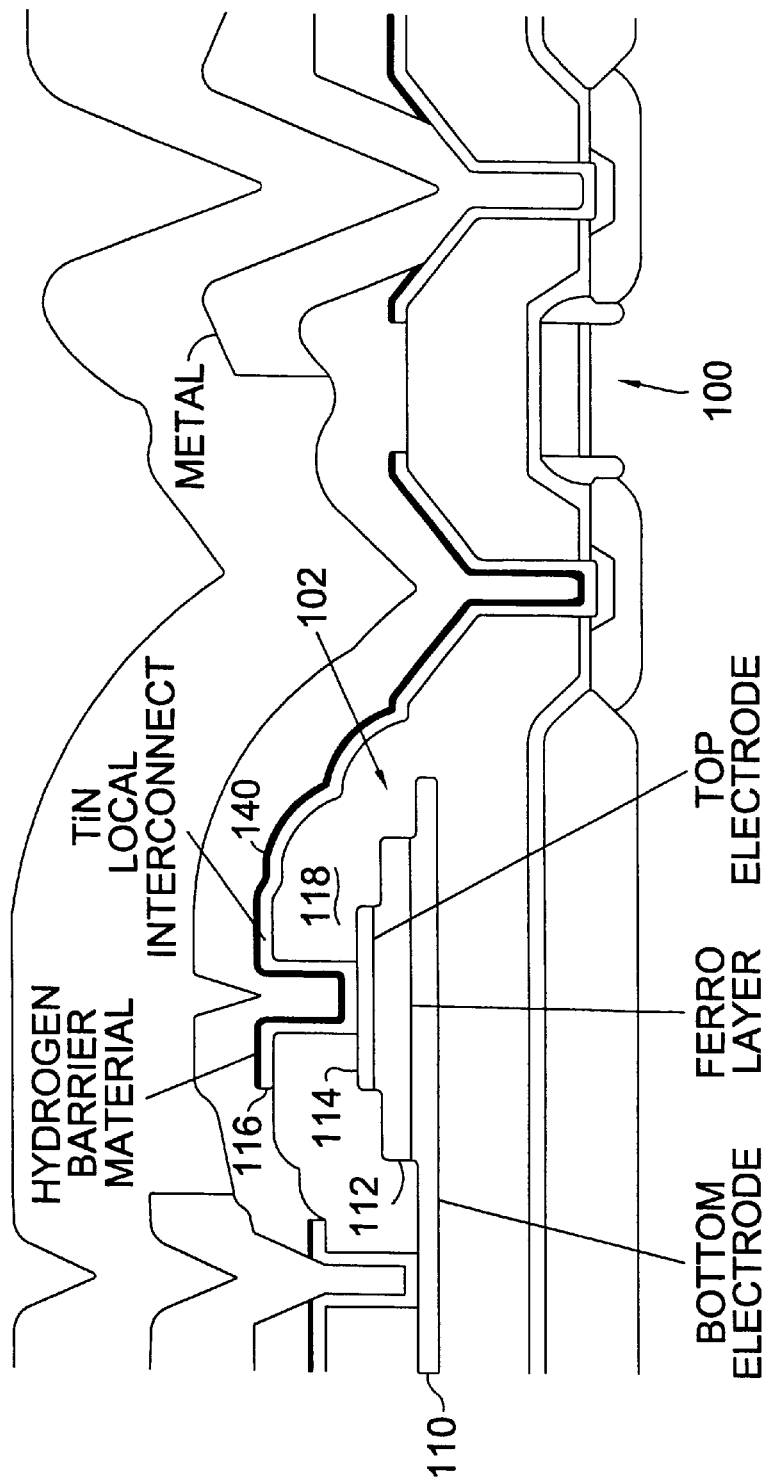
FIG. 5 is a partial cut-away view of a portion of an integrated circuit memory device in accordance with one embodiment of the present invention illustrating an access transistor and capacitor of a typical memory cell thereof and incorporating a hydrogen barrier material layer overlying the TiN local interconnect thereof to control hydrogen induced degradation of the ferroelectric dielectric capacitor.

With reference additionally now to FIG. 5, a partial, cut-away view of a portion of a ferroelectric integrated circuit memory device in accordance with one embodiment of the present invention is shown. As shown schematically in FIG. 1, a memory cell of such a device may include one or more access transistors 100 and an associated capacitor 102. As also shown in FIG. 2, the capacitor 102 includes a bottom electrode 110, a ferroelectric dielectric 112 and a top electrode 114. Electrical contact to the latter is made by means of a TEC comprising a portion of the local interconnect 116 (such as TiN) formed through an opening in the FEO 118. In the embodiment illustrated, a hydrogen barrier material layer 140, for purposes of example only $Si_3N_4$, has been formed overlying the local interconnect 116 between the access transistor 100 and the top electrode 114 in the region of the TEC to control hydrogen induced degradation of the ferroelectric dielectric capacitor 102. The hydrogen barrier material layer 140 is also formed overlying the upper portions of the metalization forming the electrical contact to the bottom electrode 110.

Figure 6:
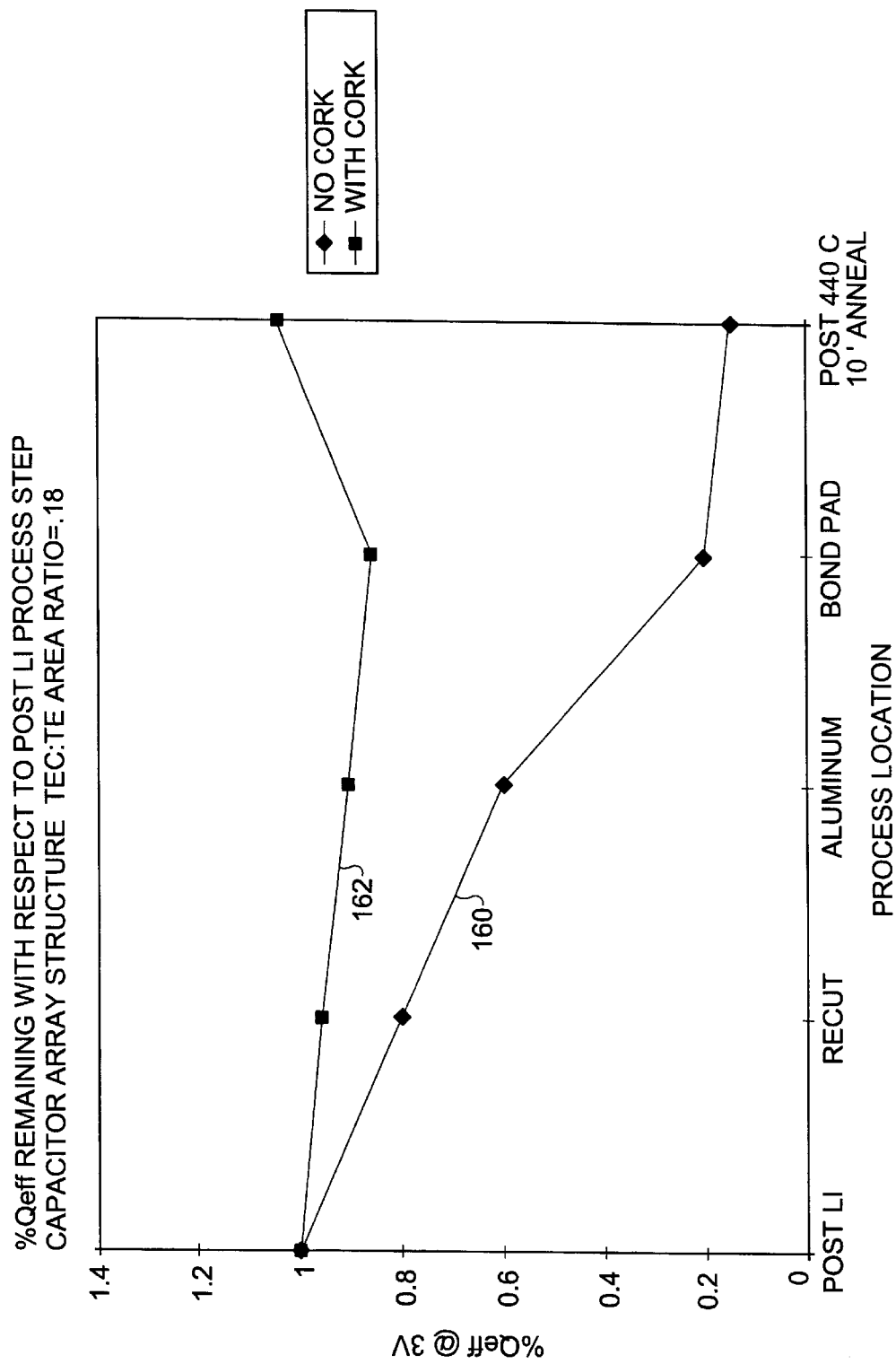
FIG. 6 is a graphical representation of the percentage of effective charge remaining (%$Q_{eff}$ at 3 volts) versus process location for cork only encapsulation in the top electrode contact region (■=with cork) vs. no cork (♦=no cork) encapsulation.

With reference additionally now to FIG. 6, a graphical representation of the percentage of effective charge remaining (%$Q_{eff}$ at 3 volts) versus process location for two different encapsulation types for integrated circuit ferroelectric memory devices in accordance with the present invention (♦=no cork; ■=with cork) is shown. Plot 160 (♦=no cork) illustrates the observed %$Q_{eff}$ remaining in a conventionally processed ferroelectric capacitor in which no hydrogen barrier material "cork" (as shown in FIG. 5) is utilized. Upon completion of the post 440° C. annealing operation, %$Q_{eff}$ is less than 0.2. In comparison, plot 162 (■=with cork) results in a %$Q_{eff}$ greater than 1.0.

Now by combining the contact cork barrier structure (which eliminates hydrogen diffusion through the top electrode contact region) together with the sidewall barrier structure, a robust hydrogen barrier structure results. Further enhancement and complete encapsulation occurs by adding a hydrogen barrier material under the bottom electrode which seals the ferroelectric capacitor completely in a hydrogen barrier box structure. By way of example, the following drawings and process flows are provided showing several methods of integration with conventional IC processing methodologies.

Figure 7A:
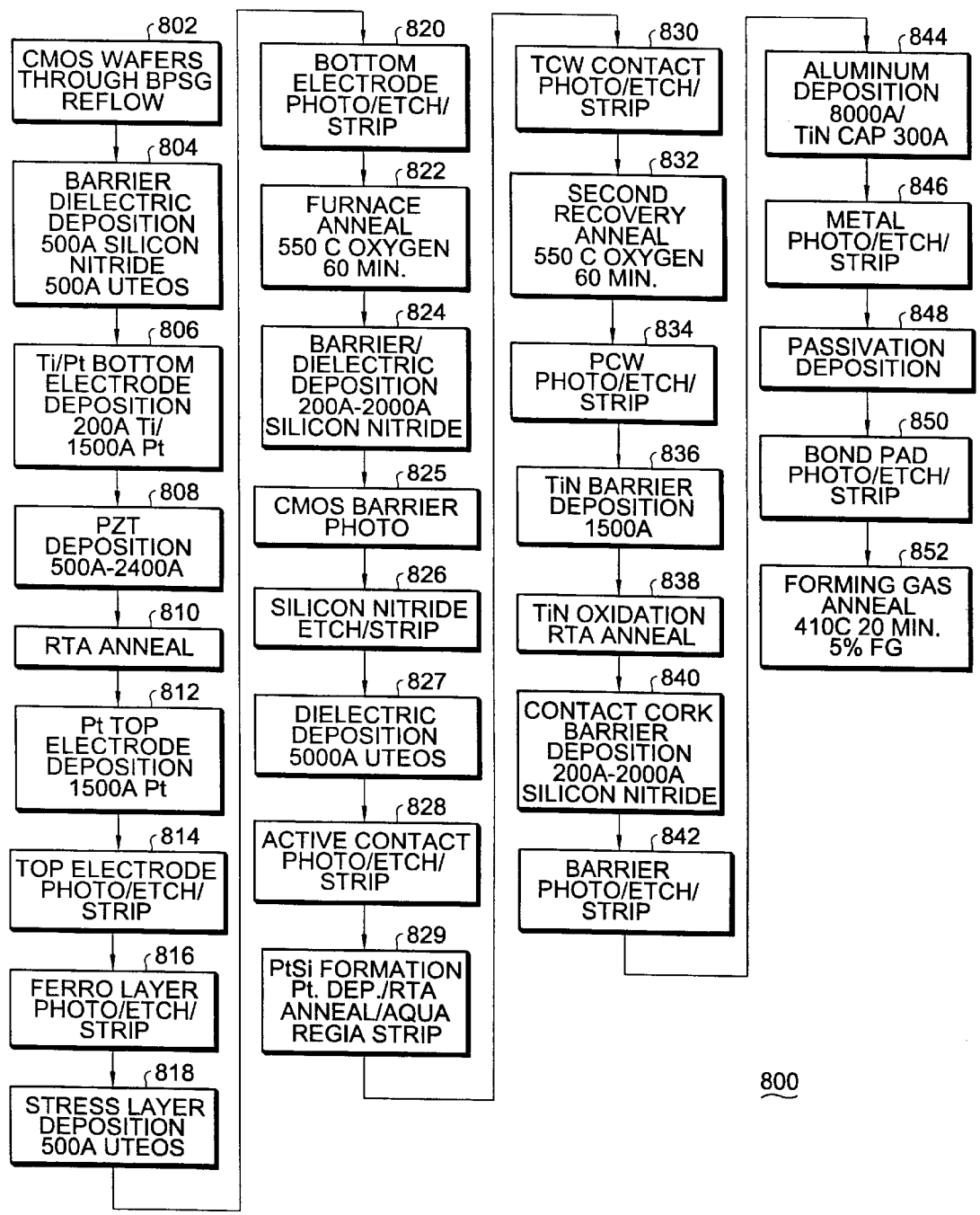
FIG. 7A is a process flow chart for a hydrogen barrier encapsulation process in accordance with a particular technique of the present invention for utilization with a single level metal interconnection layer.

With reference additionally now to FIG. 7A, a process flow chart for a hydrogen barrier encapsulation process 800 in accordance with a particular technique of the present invention is shown for utilization with a single level metal interconnection layer. The process 800 comprises the following steps:

Step 802: CMOS Wafers Through BPSG Reflow;
Step 804: Barrier Dielectric Deposition 500 Å silicon nitride/500 Å UTEOS;
Step 806: Ti/Pt Bottom Electrode Deposition 200 Å Ti/1500 Å platinum:
Step 808: PZT Deposition 500 Å–2400 Å
Step 810: RTA Anneal
Step 812: Pt Top Electrode Deposition 1500 Å platinum
Step 814: Top Electrode Photo/Etch/Strip
Step 816: Ferroelectric Layer Photo/Etch/Strip
Step 818: Stress Layer Deposition 500 Å UTEOS
Step 820: Bottom Electrode Photo/Etch/Strip (over-etch into silicon nitride layer)
Step 822: Furnace Anneal 550° C. oxygen 60 min.
Step 824: Barrier/Dielectric Deposition 200 Å–2000 Å silicon nitride
Step 825: CMOS Barrier Photo (Oversized BE Mask)
Step 826: Silicon Nitride Etch/Strip
Step 827: Dielectric Deposition 5,000 Å UTEOS
Step 828: Active Contact Photo/Etch/Strip
Step 829: PtSi formation (Pt deposition/RTA Anneal/aqua regia strip)
Step 830: TCW Contact Photo/Etch/Strip
Step 832: Second Recovery Anneal 550° C. oxygen 60 min.
Step 834: PCW Photo/Etch/Strip
Step 836: TiN Barrier Deposition 1500 Å
Step 838: TiN Oxidation RTA Anneal
Step 840: Contact Cork Barrier Deposition 200 Å–2000 Å silicon nitride
Step 842: Barrier Photo/Etch/Strip (Use TE Mask, isotropic etch, stop on TiN)
Step 844: Aluminum Deposition 8000 Å/TiN Cap 300 Å
Step 846: Metal Photo/Etch/Strip
Step 848: Passivation Deposition
Step 850: Bond Pad Photo/Etch/Strip
Step 852: Forming Gas Anneal (410° C. for 20 minutes with 5% FG)

Figure 7B:
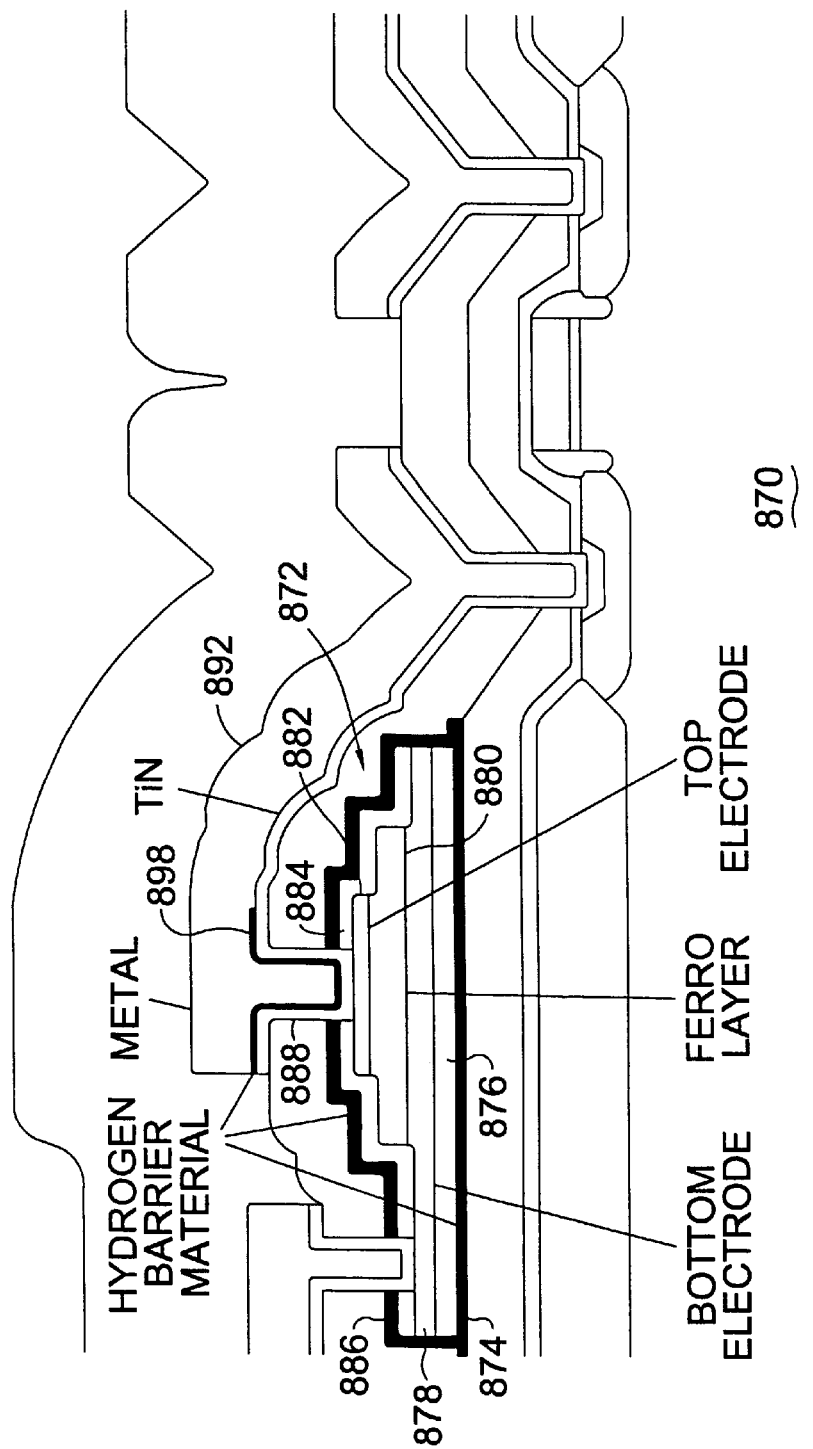
FIG. 7B is a partial, cut-away cross-sectional view of a memory cell of an integrated circuit ferroelectric memory device manufactured in accordance with the process flow of FIG. 7A illustrative of the placement of the hydrogen barrier material thereon.

With reference additionally now to FIG. 7B, a partial, cut-away cross-sectional view of a memory cell 870 of an integrated circuit ferroelectric memory device manufactured in accordance with the process flow of FIG. 7A is shown illustrative of the placement of the hydrogen barrier material thereon to effectively completely encapsulate the ferroelectric capacitor 872.

Figure 8A:
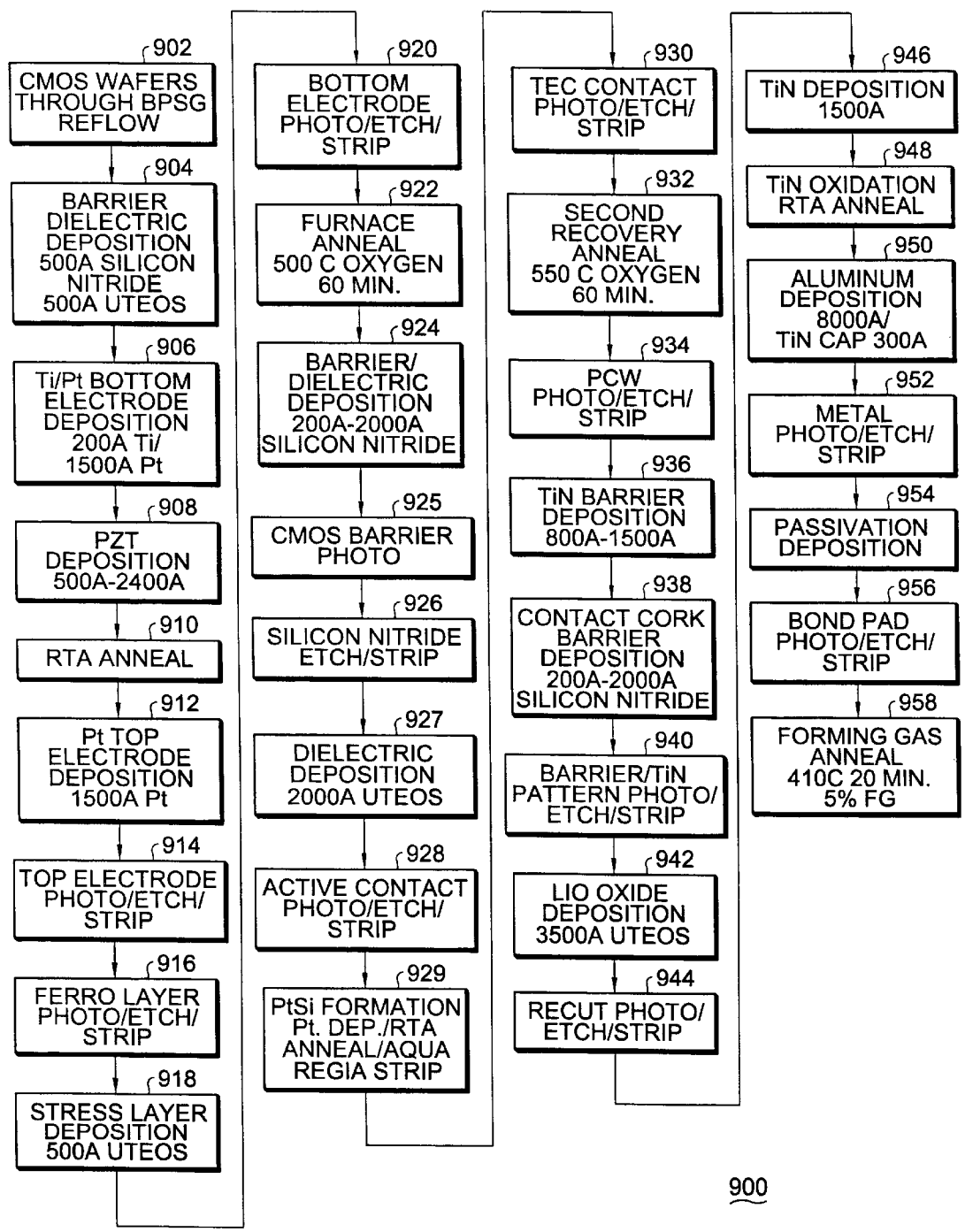
FIG. 8A is a process flow chart for a hydrogen barrier encapsulation process in accordance with a particular technique of the present invention for utilization with a local interconnect.

The ferroelectric capacitor 872 includes an underlying hydrogen barrier material layer 874 of substantially 500 Å of $Si_3N_4$ and an overlying layer 876 of substantially 500 Å of UTEOS formed at step 804 of FIG. 8A. The bottom electrode 878 is then formed at step 806 (alternatively oxides of iridium [$IrO_x$] or ruthenium [RuO] may be used instead of the platinum and titanium illustrated) while the ferroelectric dielectric 880 layer is laid down at step 808. The top electrode 882 is formed at step 812 and patterned at step 814. An overlying stress layer 884 is formed at step 818. An additional layer of hydrogen barrier material 886 is then formed at step 824 on the upper surface of the patterned stress layer 884 to make contact with the underlying hydrogen barrier material layer 874 adjacent the bottom electrode 878. Contact to the top electrode 882 is then made through the hydrogen barrier material layer 886 and overlying UTEOS to form the TEC 888 at step 836. At steps 840 and 842, the contact "cork" 890 is then formed overlying the TiN TEC 888 and metalization of the device commences at step 844 to ultimately form the metal layer 892.

With reference additionally now to FIG. 8A, a process flow chart for a hydrogen barrier encapsulation process 900 in accordance with another particular technique of the present invention is shown. The process 900 comprises the following steps:

Step 902: CMOS Wafers Through BPSG Reflow

Step 904: Barrier Dielectric Deposition 500 Å silicon nitride/500 Å UTEOS

Step 906: Ti/Pt Bottom Electrode Deposition 200 Å Ti/1500 Å platinum

Step 908: PZT Deposition 500 Å–2400 Å

Step 910: RTA Anneal

Step 912: Pt Top Electrode Deposition 1500 Å platinum

Step 914: Top Electrode Photo/Etch/Strip

Step 916: Ferroelectric Layer Photo/Etch/Strip

Step 918: Stress Layer Deposition 500 Å UTEOS

Step 920: Bottom Electrode Photo/Etch/Strip (over-etch into silicon nitride layer)

Step 922: Furnace Anneal 550° C. oxygen 60 min.

Step 924: Barrier/Dielectric Deposition 200 Å–1500 Å silicon nitride

Step 925: CMOS Barrier Photo (oversized BE Mask)

Step 926: Silicon Nitride Etch/Strip

Step 927: Dielectric Deposition 2,000 Å UTEOS

Step 928: Active Contact Photo/Etch/Strip

Step 929: PtSi formation (Pt deposition/RTA Anneal/aqua regia strip)

Step 930: TEC Contact Photo/Etch/Strip

Step 932: Second Recovery Anneal 550° C. oxygen 60 min.

Step 934: PCW Photo/Etch/Strip

Step 936: TiN Barrier Deposition 800 Å–1500 Å

Step 938: Contact Cork Barrier Deposition 200 Å–2000 Å silicon nitride

Step 940: Barrier/TiN Pattern Photo/Etch/Strip

Step 942: LIO Oxide Deposition 3500 Å UTEOS

Step 944: Re-cut Photo/Etch/Strip

Step 946: TiN Deposition 1500 Å

Step 948: TiN Oxidation RTA Anneal

Step 950: Aluminum Deposition 8000 Å/TiN Cap 300 Å

Step 952: Metal Photo/Etch/Strip

Step 954: Passivation Deposition

Step 956: Bond Pad Photo/Etch/Strip

Step 958: Forming Gas Anneal (410° C. for 20 minutes with 5% FG)

Figure 8B:
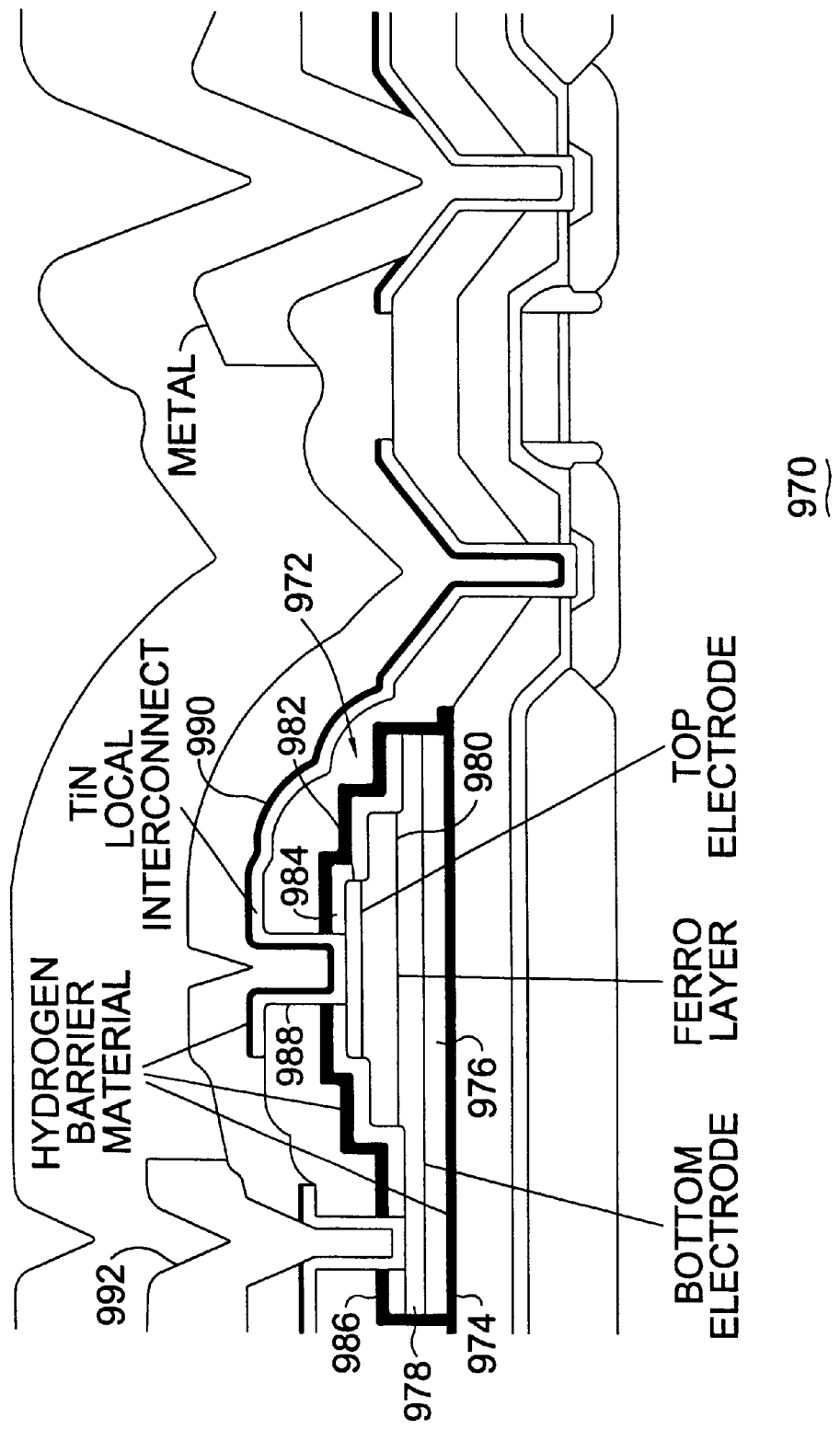
FIG. 8B is a partial, cut-away cross-sectional view of a memory cell of an integrated circuit ferroelectric memory device manufactured in accordance with the process flow of FIG. 8A illustrative of the placement of the hydrogen barrier material thereon.

With reference additionally now to FIG. 8B, a partial, cut-away cross-sectional view of a memory cell 970 of an integrated circuit ferroelectric memory device manufactured in accordance with the process flow of FIG. 8A is shown illustrative of the placement of the hydrogen barrier material thereon to effectively completely encapsulate the ferroelectric capacitor 972.

Figure 9A:
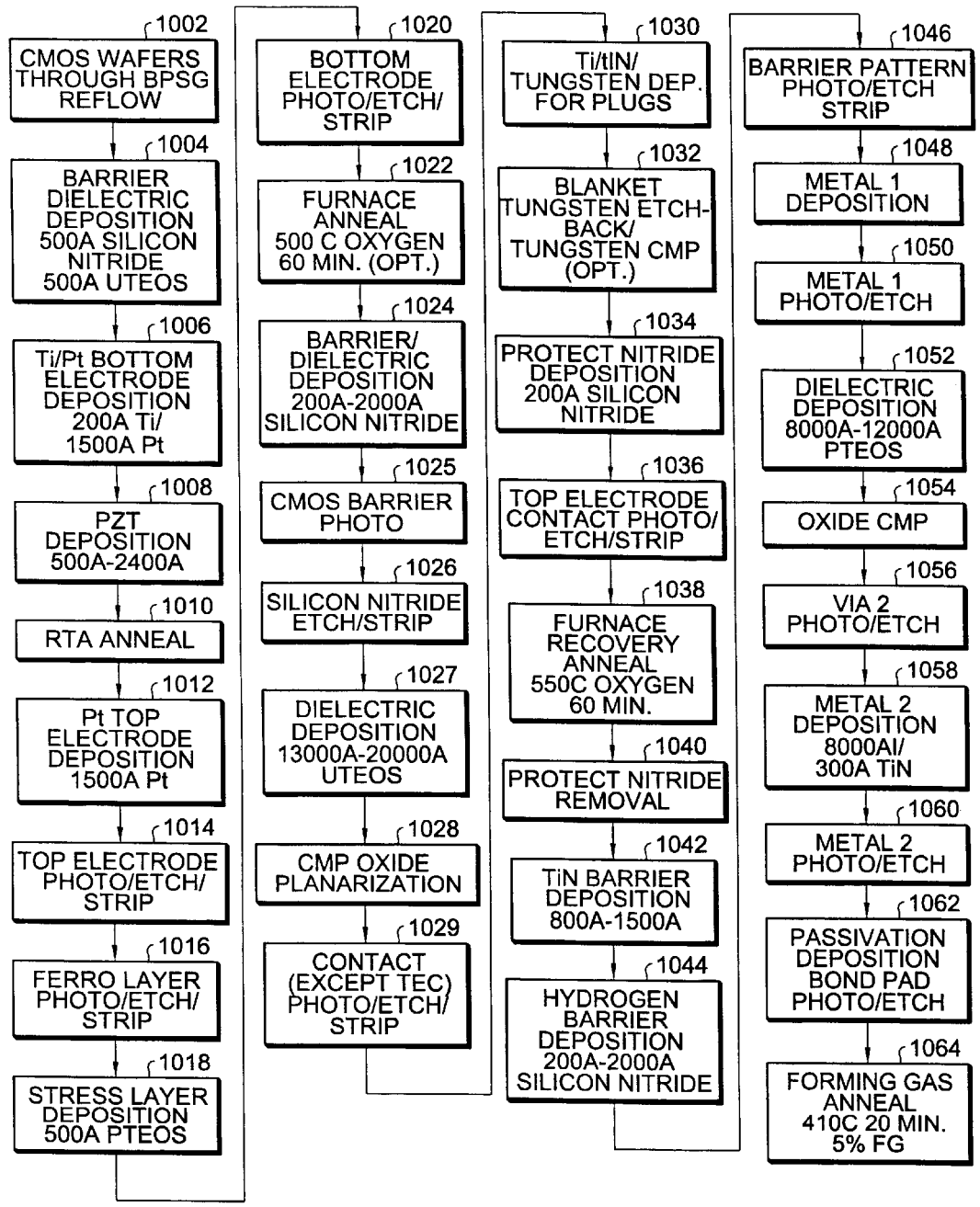
FIG. 9A is a process flow chart for a hydrogen barrier encapsulation process in accordance with a particular technique of the present invention for utilization with multilevel metal layers and tungsten (W) plugs.

The ferroelectric capacitor 972 includes an underlying hydrogen barrier material layer 974 of substantially 500 Å of $Si_3N_4$ and an overlying layer 976 of substantially 500 Å of UTEOS formed at step 904 of FIG. 9A. The bottom electrode 978 is then formed at step 906 while the ferroelectric dielectric 980 layer is laid down at step 908. The top electrode 982 is formed at step 912 and patterned at step 914. An overlying stress layer 984 is formed at step 918. An additional layer of hydrogen barrier material 986 is then formed at step 924 on the upper surface of the patterned stress layer 984 to make contact with the underlying hydrogen barrier material layer 974 adjacent the bottom electrode 978. Contact to the top electrode 982 is then made through the hydrogen barrier material layer 986 and overlying UTEOS to form the TEC 988 at step 836. At step 938, the contact "cork" 990 is then formed overlying the TiN TEC 988 as well as the upper surface of the LI inclusive of the bottom electrode 978 contact and the contacts to the associated access transistor. Metalization of the device commences at step 954 to ultimately form the metal layer 992.

With reference additionally now to FIG. 9A, a process flow chart for a hydrogen barrier encapsulation process 1000 in accordance with another particular technique of the present invention is shown for utilization with multilevel metal layers and tungsten (W) plugs. The process 1000 comprises the following steps:

Step 1002: CMOS Wafers Through BPSG Reflow

Step 1004: Barrier Dielectric Deposition 500 Å silicon nitride/500 Å UTEOS

Step 1006: Ti/Pt Bottom Electrode Deposition 200 Å Ti/1500 Å platinum

Step 1008: PZT Deposition 500 Å–2400 Å

Step 1010: RTA Anneal

Step 1012: Pt Top Electrode Deposition 1500 Å platinum

Step 1014: Top Electrode Photo/Etch/Strip

Step 1016: Ferroelectric Layer Photo/Etch/Strip

Step 1018: Stress Layer Deposition 500 Å PTEOS

Step 1020: Bottom Electrode Photo/Etch/Strip

Step 1022: Furnace Anneal 550° C. oxygen 60 min. (optional)

Step 1024: Barrier/Dielectric Deposition 200 Å–1500 Å silicon nitride

Step 1025: CMOS Barrier Photo (oversized BE Mask)

Step 1026: Silicon Nitride Etch/Strip

Step 1027: Dielectric Deposition 13,000 Å–20,000 Å UTEOS

Step 1028: CMP Oxide Planarization

Step 1029: Contact (All except TEC) Photo/Etch

Step 1030: Ti/TiN Tungsten Deposition for Tungsten Plugs

Step 1032: Blanket Tungsten Etch-back/Tungsten CMP (optional)

Step 1034: Protect Nitride Deposition 200 Å silicon nitride

Step 1036: Top Electrode Contact Photo/Etch/Strip

Step 1038: Furnace Recovery Anneal 550° C. 60 min. oxygen

Step 1040: Protect Nitride Removal—short blanket nitride etch

Step 1042: TiN Barrier Deposition 800 Å–1500 Å

Step 1044: Hydrogen Barrier Deposition 200 Å–2000 Å silicon nitride

Step 1046: Barrier Pattern Photo/Etch/Strip (top electrode mask)

Step 1048: Metal 1 Deposition 5000 Å Al/300 Å TiN

Step 1050: Metal 1 Photo/Etch

Step 1052: Dielectric Deposition 8000 Å–12,000 Å PTEOS

Step 1054: Oxide CMP

Step 1056: Via 2 Photo/Etch

Step 1058: Metal 2 Deposition 8000 Å Al 300 Å TiN

Step 1060: Metal 2 Photo/Etch

Step 1062: Passivation Deposition Bond Pad Photo/Etch

Step 1064: Forming Gas Anneal (410° C. for 20 minutes with 5% FG)

Figure 9B:
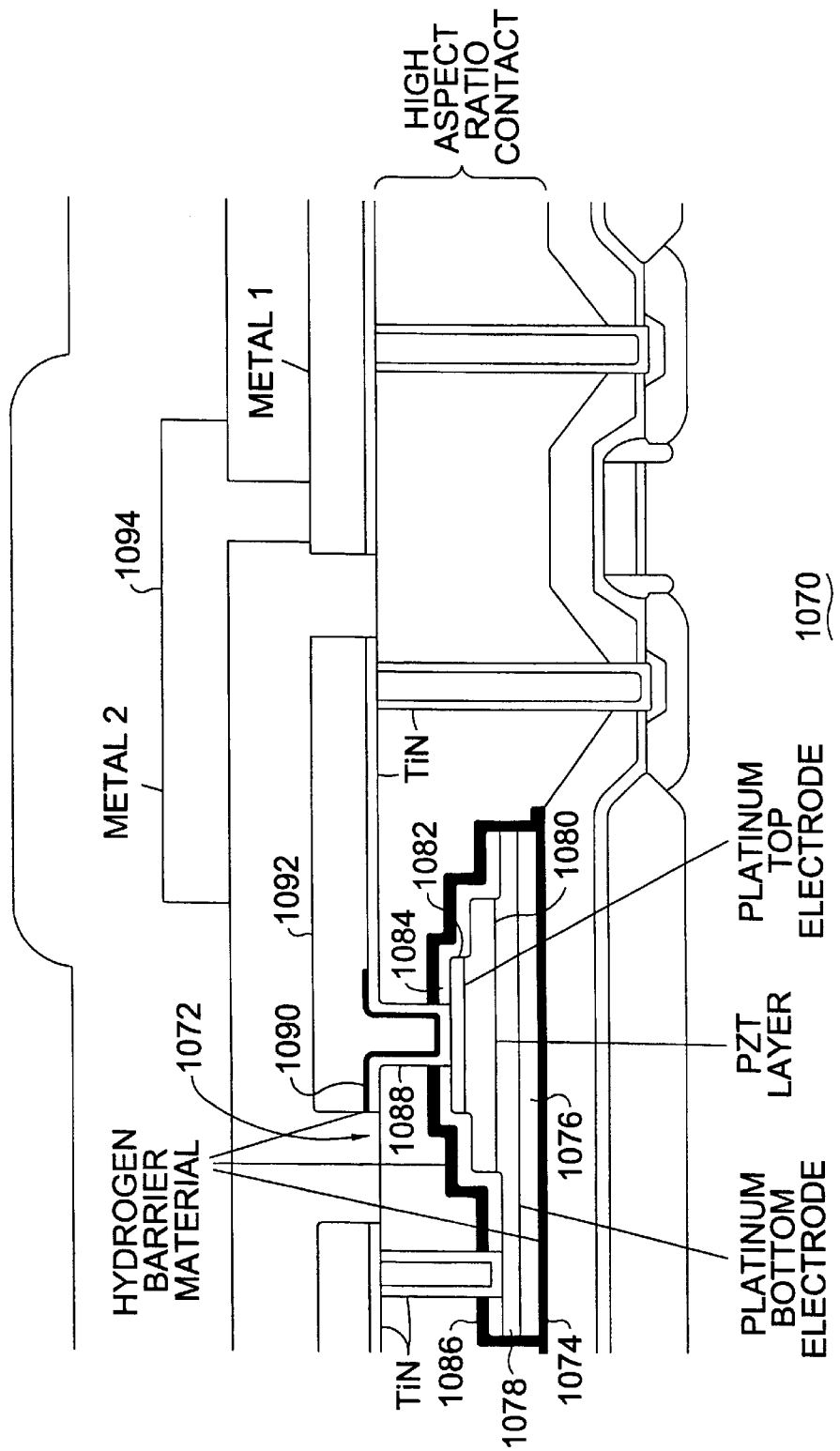
FIG. 9B is a partial, cut-away cross-sectional view of a memory cell of an integrated circuit ferroelectric memory device utilizing high aspect ratio tungsten plugs manufactured in accordance with the process flow of FIG. 9A illustrative of the placement of the hydrogen barrier material thereon.

With reference additionally now to FIG. 9B, a partial, cut-away cross-sectional view of a memory cell 1070 of an integrated circuit ferroelectric memory device utilizing high aspect ratio tungsten plugs manufactured in accordance with the process flow of FIG. 9A is shown illustrative of the placement of the hydrogen barrier material thereon to effectively completely encapsulate the ferroelectric capacitor 1072.

Figure 10A:
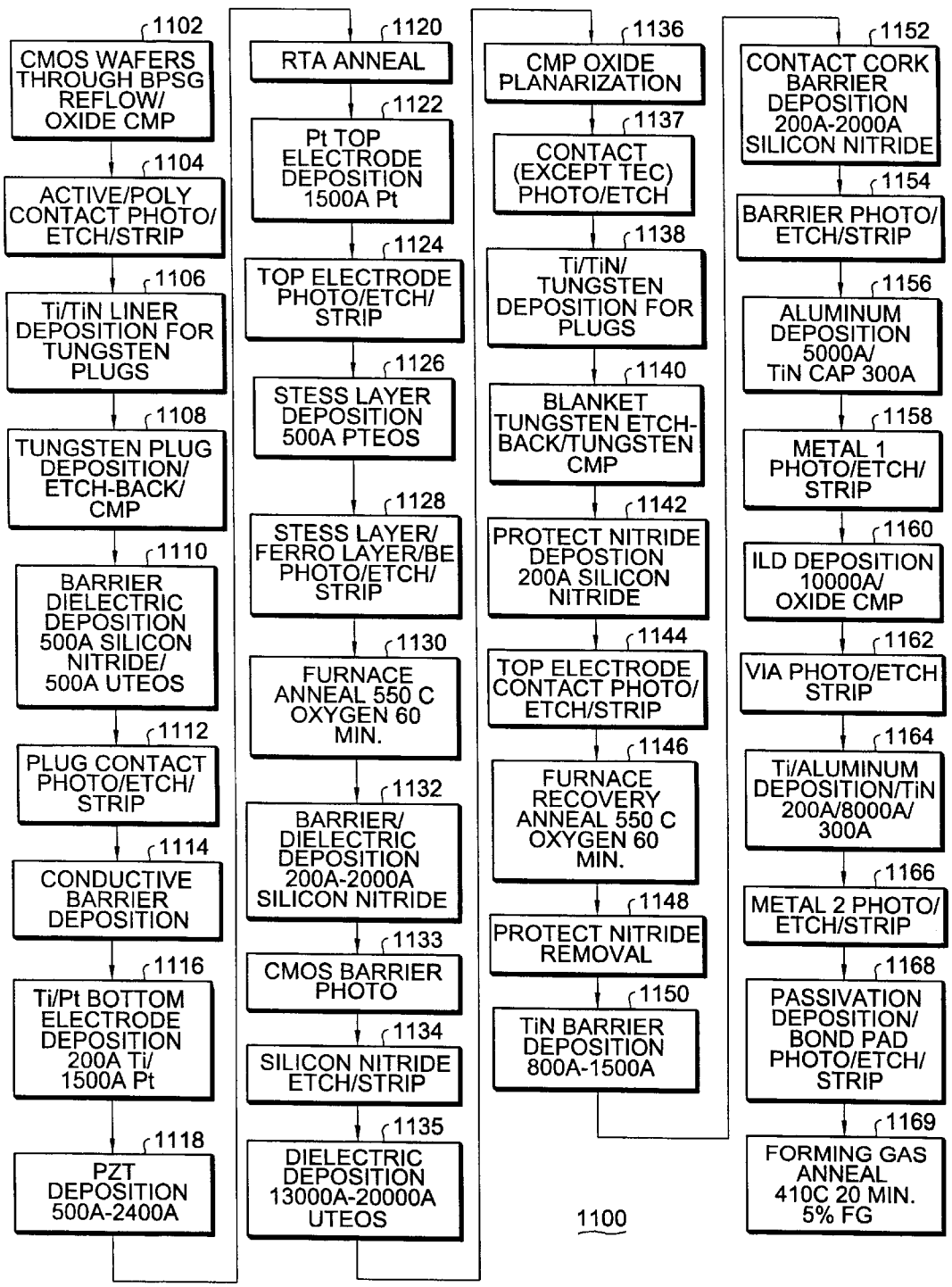
FIG. 10A is a process flow chart for a hydrogen barrier encapsulation process in accordance with a particular technique of the present invention for utilization with ferroelectric memory cells formed over tungsten (W) plugs.

The ferroelectric capacitor 1072 includes an underlying hydrogen barrier material layer 1074 of substantially 500 Å of $Si_3N_4$ and an overlying layer 1076 of substantially 500 Å of UTEOS formed at step 1004 of FIG. 10A. The bottom electrode 1078 is then formed at step 1006 while the ferroelectric dielectric 1080 layer is laid down at step 1008. The top electrode 1082 is formed at step 1012 and patterned at step 1014. An overlying stress layer 1084 is formed at step 1018. An additional layer of hydrogen barrier material 1086 is then formed at step 1024 on the upper surface of the patterned stress layer 1084 to make contact with the underlying hydrogen barrier material layer 1074 adjacent the bottom electrode 1078. Contact to the top electrode 1082 is then made through the hydrogen barrier material layer 1086 and overlying UTEOS to form the TEC 1088 at step 1036. At step 1044, the contact "cork" 1090 is then formed overlying the TiN TEC 1088. The first metalization layer (Metal 1) 1092 is deposited at step 1048, processed and the second metalization layer (Metal 2) 1094 is added at step 1058. As can be seen, the tungsten plugs formed in the process 1000 are formed to provide electrical contact to the access transistor(s) and bottom electrode 1078 of the capacitor 1072 through the metalization layer 1092.

With reference additionally now to FIG. 10A, a process flow chart for a hydrogen barrier encapsulation process 1100 in accordance with another particular technique of the present invention is shown for utilization with ferroelectric memory cells formed over tungsten (W) plugs. The process 1100 comprises the following steps:

Step 1102: CMOS Wafers Through BPSG Reflow/Oxide CMP

Step 1104: Active/Polysilicon Contact Photo/Etch/Strip

Step 1106: Ti/TiN Liner Deposition for Tungsten Plugs

Step 1108: Tungsten Plug Deposition/Etch-back/CMP

Step 1110: Barrier Dielectric Deposition 500 Å silicon nitride/500 Å UTEOS

Step 1112: Plug Contact Photo/Etch/Strip

Step 1114: Conductive Barrier Deposition

Step 1116: Ti/Pt Bottom Electrode Deposition 200 Å Ti/1500 Å platinum

Step 1118: PZT Deposition 500 Å–2400 Å

Step 1120: RTA Anneal

Step 1122: Pt Top Electrode Deposition 1500 Å platinum

Step 1124: Top Electrode Photo/Etch/Strip

Step 1126: Stress Layer Deposition 500 Å PTEOS

Step 1128: Stress Layer, Ferroelectric Layer, BE Photo/Etch/Strip

Step 1130: Furnace Anneal 550° C. oxygen 60 min.

Step 1132: Barrier/Dielectric Deposition 200 Å–1500 Å silicon nitride

Step 1133: CMOS Barrier Photo (oversized BE mask)

Step 1134: Silicon Nitride Etch/Strip

Step 1135: Dielectric Deposition 13,000 Å–20,000 Å UTEOS

Step 1136: CMP Oxide Planarization

Step 1137: Contact (all except TEC) Photo/Etch (first etch stop on silicon nitride in active contact/then silicon nitride etch)

Step 1138: Ti/TiN/Tungsten Deposition for Tungsten Plugs

Step 1140: Blanket Tungsten Etch-back/Tungsten CMP

Step 1142: Protect Nitride Deposition 200 Å silicon nitride

Step 1144: Top Electrode Contact Photo/Etch/Strip

Step 1146: Furnace Recovery Anneal 550° C. 60 min. oxygen

Step 1148: Protect Nitride Removal—short blanket nitride etch

Step 1150: TiN Barrier Deposition 800 Å–1500 Å

Step 1152: Contact Cork Barrier Deposition 200 Å–2000 Å silicon nitride

Step 1154: Barrier Photo/Etch/Strip (Use TE Mask, isotropic etch, stop on TiN)

Step 1156: Aluminum Deposition 5000 Å/TiN Cap 300 Å

Step 1158: Metal 1 Photo/Etch/Strip

Step 1160: ILD Deposition 10,000 Å/Oxide CMP

Step 1162: Via Photo/Etch/Strip

Step 1164: Ti/Aluminum Deposition/TiN 200 Å/8000 Å/1300 Å

Step 1166: Metal 2 Photo/Etch/Strip

Step 1168: Passivation Deposition Bond Pad Photo/Etch/Strip

Step 1169: Forming Gas Anneal (410° C. for 20 minutes with 5% FG)

Figure 10B:
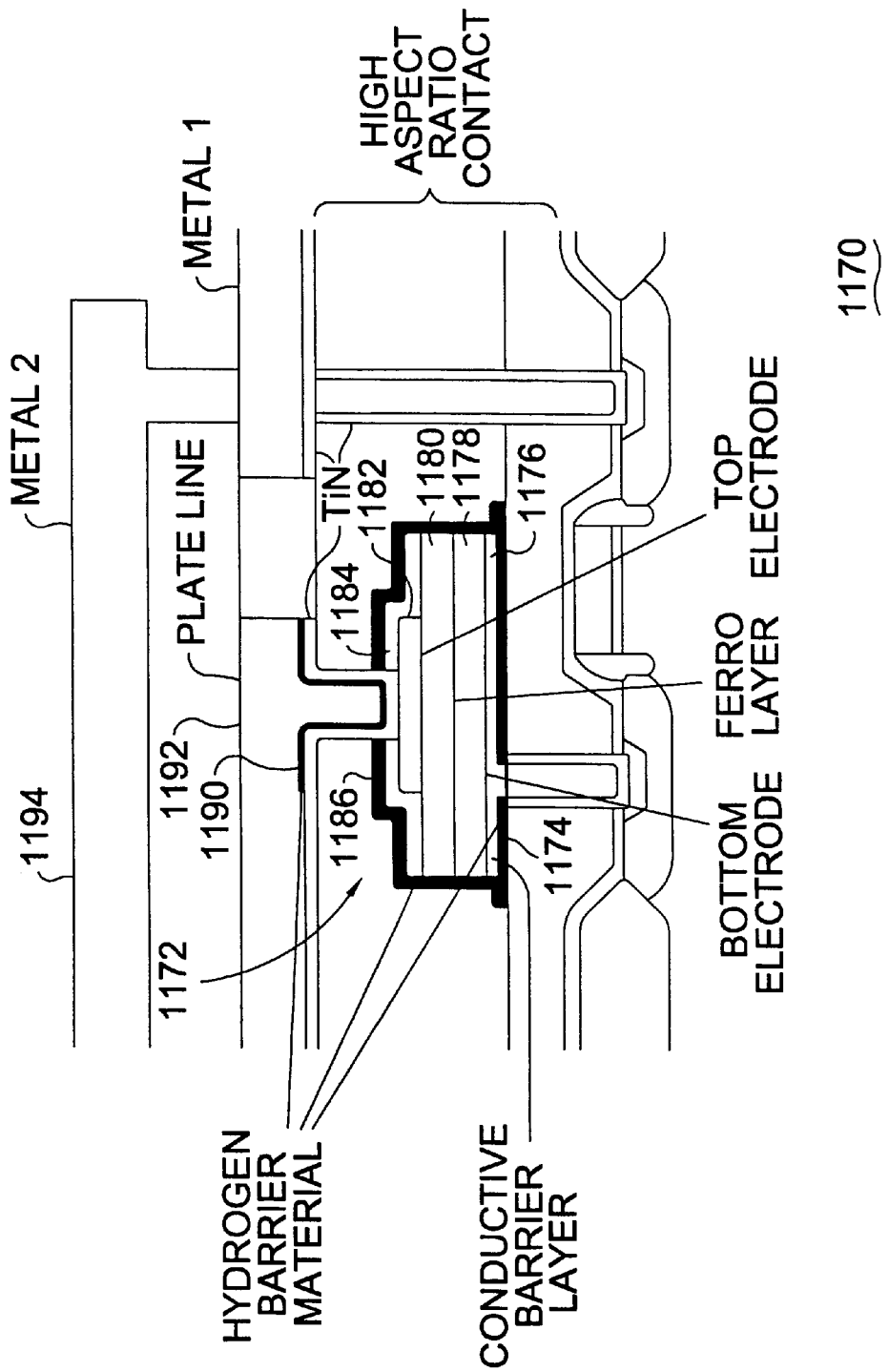
FIG. 10B is a partial, cut-away cross-sectional view of a memory cell of an integrated circuit ferroelectric memory device manufactured in accordance with the process flow of FIG. 10A illustrative of the placement of the hydrogen barrier material thereon.

With reference additionally now to FIG. 10B, a partial, cut-away cross-sectional view of a memory cell 1170 of an integrated circuit ferroelectric memory device manufactured in accordance with the process flow of FIG. 10A is shown illustrative of the placement of the hydrogen barrier material thereon to effectively completely encapsulate the ferroelectric capacitor 1172.

The ferroelectric capacitor 1172 includes an underlying conductive hydrogen barrier material layer 1174 of substantially 500 Å in thickness contacting a tungsten plug providing coupling to an associated access transistor. An overlying layer 1176 of substantially 500 Å of UTEOS is formed at step 1110 of FIG. 11A. The bottom electrode 1178 is then formed at step 1116 while the ferroelectric dielectric 1180 layer is laid down at step 1118. The top electrode 1182 is formed at step 1122 and patterned at step 1124. An overlying stress layer 1184 is formed at step 1126. An additional layer of hydrogen barrier material 1186 is then formed at step 1132 on the upper surface of the patterned stress layer 1184 to make contact with the underlying hydrogen barrier material layer 1174 adjacent the bottom electrode 1178. Contact to the top electrode 1182 is then made through the hydrogen barrier material layer 1186 and overlying UTEOS to form the TEC 1188 at step 1144. At step 1152, the contact "cork" 1190 is then formed overlying the TiN TEC 1188. The first metalization layer (Metal 1) 1192 is deposited at step 1156, processed and the second metalization layer (Metal 2) 1194 is added at step 1164.

What has been provided, therefore, is a hydrogen barrier encapsulation technique for the control of hydrogen induced degradation of ferroelectric capacitors for non-volatile integrated circuit memory devices. The resultant device structure serves to reduce or eliminate the hydrogen induced degradation of ferroelectric capacitors by completely encapsulating the capacitor within a suitable hydrogen barrier material. In a preferred embodiment, the hydrogen barrier material may comprise chemical vapor deposition ("CVD") silicon nitride ($Si_3N_4$), PZT (or other dielectric material), $Al_2O_3$ or other suitable material thus ensuring process compatibility with industry standard multilevel metal ("MLM") process steps as well as improved passivation processes. Advantages currently recognized in the use of CVD $Si_3N_4$ as a hydrogen barrier material are that: a) it is an industry standard material which may be processed utilizing industry standard deposition and etch processes; b) unlike sputtered films, it is conformal over the device topology to provide good contact and plug step coverage; c) it is scaleable with shrinking design rules; and d) provides a higher material density than sputtered films resulting in better mechanical properties. Moreover, although the deposition process for CVD $Si_3N_4$ contains hydrogen, the deposition time is relatively short thereby allowing the TiN layer to act as a "short term" hydrogen barrier. The techniques of the present invention are applicable to all known ferroelectric dielectrics including Perovskites and layered Perovskites (whether doped or undoped) including lead zirconium titanate ("PZT"), lead lanthanum zirconium titanate ("PLZT"), barium strontium titanate ("BST"), strontium bismuth tantalate ("SBT" such as "Y1™" a trademark of Symetix Corporation) and others while simultaneously allowing for a potentially broader choice of electrode materials. Still further, the techniques of the present invention allow for the utilization of a forming gas (or hydrogen) anneal process to be performed on the IC structure.

While there have been described above the principles of the present invention in conjunction with specific ferroelectric materials, capacitor structures and memory cell designs, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been-formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A process for forming an integrated circuit device including at least one capacitor integrated thereon, said process comprising:

providing a substrate having a major surface thereof;

forming a first hydrogen barrier material layer overlying said substrate;

forming a first insulating layer overlying said first hydrogen barrier material layer;

forming a first electrode layer overlying said first insulating layer and substantially coextensive therewith;

forming a dielectric layer overlying said first electrode layer;

forming a second electrode layer overlying said dielectric layer;

forming a second insulating layer overlying exposed portions of said first electrode layer, said dielectric layer and said second electrode layer;

forming a second hydrogen barrier material layer contiguous with said first hydrogen barrier material layer and overlying said second insulating layer;

forming a contact electrically adjoining said second electrode layer at an upper surface thereof through an opening formed in said second insulating layer and said second hydrogen barrier material layer; and forming an additional hydrogen barrier material layer overlying said contact.

2. The process of claim 1 wherein said steps of forming said first, second and additional hydrogen barrier material layers are carried out by the deposition of a material selected from a group comprising silicon nitride, lead zirconium titanate and alumina.

3. The process of 1 wherein said step of forming said first hydrogen barrier material layer is carried out by the step of:

depositing said first hydrogen barrier material layer to a thickness of substantially 500 Å.

4. The process of claim 1 wherein said step of forming said second hydrogen barrier material layer is carried out by the step of:

depositing said second hydrogen barrier material layer to a thickness of substantially 800 Å.

5. The process of claim 1 wherein said step of forming said additional hydrogen barrier material layer is carried out by the step of:

depositing said additional hydrogen barrier material layer to a thickness of substantially between 200 Å–2000 Å.

6. The process of claim 1 wherein said steps of forming said first and second insulating layers are carried out by UTEOS.

7. The process of claim 1 wherein said step of forming said first insulating layer is carried out by the step of:

depositing said first insulating layer to a thickness of substantially 500 Å.

8. The process of claim 1 wherein said step of forming said second insulating layer is carried out by the step of:

depositing said second insulating layer to a thickness of substantially 5000 Å.

9. The process of claim 1 wherein said steps of forming first and second electrodes are carried out by depositing a material selected from a group consisting of iridium, ruthenium, platinum and titanium.

10. The process of claim 1 wherein said step of forming said first electrode comprises the step of:

depositing substantially 200 Å of titanium and 1500 Å of platinum.

11. The process of claim 1 wherein said step of forming second electrode comprises the step of:

depositing substantially 1500 Å of platinum.

12. The process of claim 1 wherein said step of forming said dielectric layer is carried out by depositing a material selected from a group consisting of Perovskites and layered-Perovskite materials.

13. The process of claim 1 wherein said step of forming said dielectric layer is carried out by the step of:

depositing said dielectric layer to a thickness of substantially 500 Å–2400 Å.

14. The process of claim 1 wherein said step of forming said contact comprises the step of:

depositing TiN.

* * * * *